(12) United States Patent
Liebmann et al.

(10) Patent No.: US 12,218,135 B2
(45) Date of Patent: Feb. 4, 2025

(54) WIRING IN DIFFUSION BREAKS IN AN INTEGRATED CIRCUIT

(71) Applicant: Tokyo Electron Limited, Tokyo (JP)

(72) Inventors: Lars Liebmann, Albany, NY (US); Jeffrey Smith, Albany, NY (US); Daniel Chanemougame, Albany, NY (US); Paul Gutwin, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 393 days.

(21) Appl. No.: 17/647,938

(22) Filed: Jan. 13, 2022

(65) Prior Publication Data

US 2023/0223404 A1    Jul. 13, 2023

(51) Int. Cl.
| | |
|---|---|
| *H01L 27/092* | (2006.01) |
| *H01L 27/06* | (2006.01) |
| *H01L 29/423* | (2006.01) |
| *H01L 29/78* | (2006.01) |

(52) U.S. Cl.
CPC ...... *H01L 27/0924* (2013.01); *H01L 27/0688* (2013.01); *H01L 29/4236* (2013.01); *H01L 29/42392* (2013.01); *H01L 29/785* (2013.01); *H01L 2029/7858* (2013.01)

(58) Field of Classification Search
CPC ............. H01L 27/0924; H01L 27/0688; H01L 29/4236; H01L 29/42392; H01L 29/785; H01L 2029/7858; H01L 29/78696; H01L 21/8221; H01L 27/088; H01L 29/0673; H01L 29/66545; H01L 27/092
See application file for complete search history.

(56) References Cited

U.S. PATENT DOCUMENTS

| | | |
|---|---|---|
| 2017/0141211 A1 | 5/2017 | Xie et al. |
| 2019/0355719 A1 | 11/2019 | Maeda et al. |
| 2020/0373330 A1 | 11/2020 | Liebmann et al. |
| 2020/0381426 A1* | 12/2020 | Xu .......... H01L 27/088 |

(Continued)

FOREIGN PATENT DOCUMENTS

KR    20190131757 A    11/2019

OTHER PUBLICATIONS

Moore, Samuel K., "Buried Power Lines Make Memory Faster, Researchers at imec explore strategy that could make memory more efficient and pack in more transistors," https://spectrum.ieee.org/buried-power-lines-make-memory-faster, Jul. 26, 2019, 5 pages.

(Continued)

*Primary Examiner* — Changhyun Yi
(74) *Attorney, Agent, or Firm* — Slater Matsil, LLP

(57) ABSTRACT

A semiconductor device includes a first three dimensional (3D) transistor and a second 3D transistor oriented parallel to the first 3D transistor disposed in a substrate, the first 3D transistor and the second 3D transistor being a subset of a plurality of transistors. The device includes a diffusion-break trench disposed in a region laterally separating the second 3D transistor from the first 3D transistor, the diffusion-break trench having a length extending along a lateral direction. The device includes a diffusion-break wire filling the diffusion-break trench, the diffusion-break wire having a height along a vertical direction, gates of the plurality of transistors being made of a different conductive material than the diffusion-break wire.

20 Claims, 13 Drawing Sheets

(56) References Cited

U.S. PATENT DOCUMENTS

| | | |
|---|---|---|
| 2020/0381430 A1 | 12/2020 | Liebmann et al. |
| 2021/0043630 A1 | 2/2021 | Liebmann et al. |
| 2021/0082913 A1 | 3/2021 | Yang |
| 2021/0118878 A1 | 4/2021 | Xu et al. |
| 2021/0193797 A1 | 6/2021 | Xie et al. |
| 2021/0319165 A1 | 10/2021 | Liebmann |

OTHER PUBLICATIONS

International Search Report and Written Opinion, PCT Application No. PCT/US2023/010685, mailed May 12, 2023, 12 pages.

* cited by examiner

WIRING IN DIFFUSION BREAKS IN AN INTEGRATED CIRCUIT

TECHNICAL FIELD

The present invention relates generally to integrated circuits, and, in particular embodiments, to wiring in diffusion breaks in an integrated circuit.

BACKGROUND

Generally, an integrated circuit (IC) is fabricated by sequentially depositing and patterning layers of dielectrics, metals, and semiconductors over a substrate to form a network of electronic components connected by metal lines and vias in a monolithic structure. Traditionally, innovations in photolithography such as multi-patterning and extreme ultraviolet (EUV) lithography have enabled feature sizes to be shrunk at each new technology node, roughly doubling the packing density to reduce cost and increase functionality of IC's. An increase in electric field with dimensional scaling complicates shrinking the field-effect transistor (FET) within the constraints of switching speed, leakage power, and reliability. More recently, achieving worthwhile power-performance-area-cost (PPAC) improvement involves use of three-dimensional (3D) FET structures. The 3D FET structures have evolved from a FinFET to a gate all-around FET (GAAFET) to a complementary FET (CFET), which is a vertically stacked pair of FET's, for example, a p-type FET over an n-type FET. The FinFET has a layered high-k, metal-gate (HKMG) gate wrapping over a vertically protruding thin fin-shaped semiconductor channel, while the GAAFET structure is a vertical stack of thin semiconductor nanosheets or nanowires having a shared HKMG gate filling a space between vertically adjacent nanosheets and wrapping around to connect along two vertical sides of the stack. The 3D architecture of CFET further reduces the device footprint by vertically stacking two transistors. However, to fully exploit that achievement, innovations are needed in efficiently wiring the 3D devices.

SUMMARY

A semiconductor device includes a first three dimensional (3D) transistor and a second 3D transistor oriented parallel to the first 3D transistor disposed in a substrate, the first 3D transistor and the second 3D transistor being a subset of a plurality of transistors. The device includes a diffusion-break trench disposed in a region laterally separating the second 3D transistor from the first 3D transistor, the diffusion-break trench having a length extending along a lateral direction. The device includes a diffusion-break wire filling the diffusion-break trench, the diffusion-break wire having a height along a vertical direction, gates of the plurality of transistors being made of a different conductive material than the diffusion-break wire.

A method of forming a semiconductor device includes forming a first three dimensional (3D) transistor in a first region and a second 3D transistor oriented parallel to the first 3D transistor in a second region. The method includes forming a diffusion-break trench between the second 3D transistor and the first 3D transistor, the diffusion-break trench extending along a first lateral direction. The method includes forming a diffusion-break wire by filling the diffusion-break trench, the diffusion-break wire having a height along a vertical direction, where filling the diffusion-break trench includes forming a conductive core, gates of the first and the second transistors being made of a different conductive material than the diffusion-break wire.

A semiconductor device includes a first three dimensional (3D) disposed in a substrate; a first circuit component disposed in the substrate; a diffusion-break trench having a length extending along a first lateral direction; and a diffusion-break wire disposed in the diffusion-break trench. The diffusion-break wire includes an insulating outer liner and a first conductive core, the first conductive core electrically being coupled to an electrode of the first 3D transistor and an electrode of the first circuit component.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3A-3D illustrate cross-sectional views of the simplified standard cell shown in FIG. 1 at various intermediate stages of fabrication, in accordance with some embodiments, wherein FIG. 3A shows the vertical structure of the cell at a stage of fabrication after the CFET dummy structures have been formed and inlaid in the PMD layer, wherein FIG. 3B illustrates trenches formed in the PMD layer after removing the sacrificial gate structures, wherein FIG. 3C illustrates the vertical structure of the simplified standard cell after the diffusion-cut etch has been performed using a patterned etch mask to remove the exposed nanosheets from selected trenches forming diffusion-break trenches, wherein FIG. 3D illustrates the trenches in the diffusion areas and the diffusion-break trenches after filling and etch back;

DETAILED DESCRIPTION OF ILLUSTRATIVE EMBODIMENTS

Figure 1:
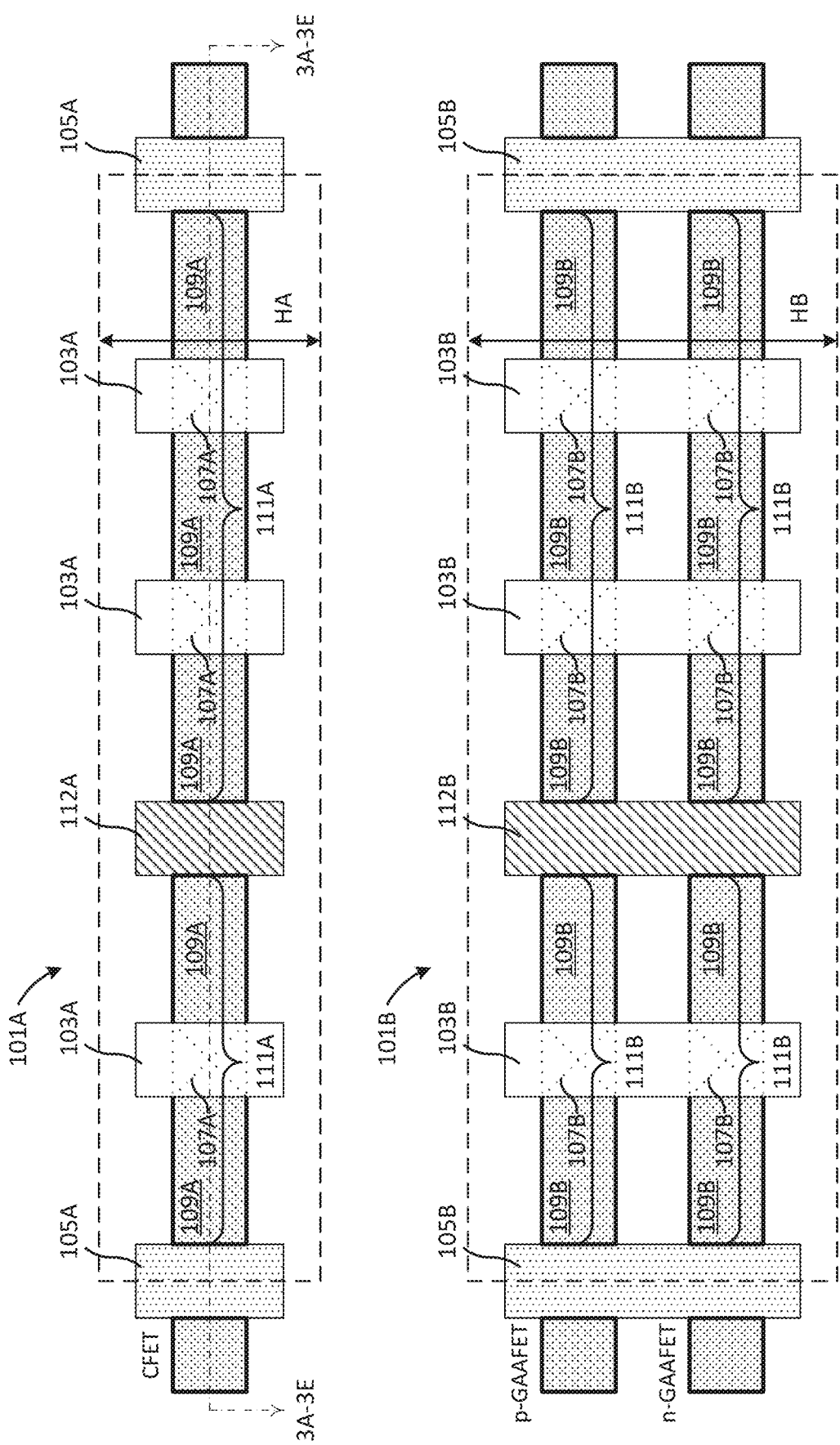
FIG. 1 illustrates schematics of two layouts of a simplified standard cell, in accordance with some embodiments.

This disclosure describes embodiments of structures and methods for forming wires, referred to as diffusion-break wires, running along lines of diffusion breaks formed between adjacent diffusion areas comprising three-dimensional (3D) transistors. The specific example embodiments described in this disclosure illustrate the inventive concepts using nanosheet transistors (NT) in a complementary metal-oxide semiconductor (CMOS) field-effect transistor (FET) integrated circuit (IC) technology. In an NT, the channel is a portion of a stack of semiconductor nanosheets where a gate structure wraps around the nanosheets. Self-aligned semiconductor source/drain (S/D) regions on opposite sides of the gate are formed from the same stack of nanosheets. The diffusion area refers to a continuous active area of NT channel and S/D regions connected physically by an unbroken nanosheet stack. After forming the diffusion areas, in various embodiments, the diffusion breaks are formed to break a long diffusion area into a row of separate diffusion areas by removing the nanosheet stack from the regions between adjacent diffusion areas, as described in further detail below. In this disclosure, the NT transistors may be the gate-all-around FET (GAAFET) or the complementary FET (CFET) comprising a vertical stack of a lower GAAFET and an upper GAAFET. The GAAFET channels may comprise nanowires or nanosheets, as mentioned in the background section. The GAAFETs and CFETs that have nanowires as the channel regions instead of nanosheets are similar to the NT and may be referred to as nanowire transistors (NWT).

The concept of the CFET is to increase the packing density of transistors by stacking several transistors vertically. The example embodiments of diffusion-break wires are described in the context of CFET structures that include a vertical stack of an n-type and a p-type GAAFET. Although the diffusion-break wires have been described for a complementary metal-oxide-semiconductor (CMOS) digital logic IC technology using CFET structures comprising a stack of two GAAFETs, the inventive aspects may be applied to technologies using active devices having other types of 3D architectures, for example, FinFET, GAAFET, or CFET having a larger stack of transistors. Since, in this disclosure, the CFET comprises a vertical stack of a first transistor and a second transistor, each CFET channel, S/D, and gate structure comprises a respective first and second channel, S/D, and gate structure.

Standard cells in a standard-cell library render combinatorial and sequential logic functions in microelectronics designs. Layouts of standard cells of a standard-cell library for implementing logic functions in digital IC's often comprise rows of diffusion areas and columns of diffusion breaks and gate structures intersecting and crossing over the rows.

As described in more detail below, embodiments described in this application enable the scaling of logic standard cells. More specifically, various embodiments increase transistor density in digital logic designs by means of reducing cell height. Cell height in standard cell logic designs is reported in numbers of wiring tracks, i.e., the number of minimum pitch wiring tracks available for routing so as to connect transistors to each other and to the input and output pins. For example, reducing the cell height from 7T to 3.5T while maintaining the same cell width amounts to about 50% area scaling or doubling the density. The reduced space for wiring tracks increases the difficulty in routing power supply lines and signals between transistors. Embodiments achieve reduction in cell height along with a novel connectivity that helps overcome wiring congestion in aggressively scaled, low track-height logic cells. The novel connectivity is achieved, in part, by utilizing otherwise wasted space in diffusion breaks as an additional wiring layer. Accordingly, embodiments enable further scaling of wiring-limited standard cells.

An embodiment of a diffusion-break wire will be discussed first using standard cell layouts in FIG. 1. Structural embodiments of CFETs having diffusion-break wires used as metal interconnects will be described using FIGS. 2A-2B, 3D, 3E, and 4-5. Embodiment methods of forming devices will be described using FIGS. 3A-3E.

FIG. 1 illustrates schematics of two layouts of a simplified standard cell: first layout 101A is for a CFET technology with a two-transistor footprint, and second layout 101B is for a GAAFET technology having a one-transistor footprint. The boundary of the standard cell is indicated by a dashed rectangle. Numeral references with the same number refer to similar entities, with those ending in A referring to first layout 101A and those ending in B referring to second layout 101B.

Each of the layouts 101A and 101B of the simplified standard cell in FIG. 1 shows six columnar tracks comprising three columns of gate structures 103A/103B and three columns of diffusion breaks, a diffusion-break line being of two types: a non-conducting diffusion-break line 105A/105B and a diffusion-break wire 112A/112B. As explained in further detail below, a diffusion-break wire comprises conductive material to which electrical contacts are made in order to connect the diffusion-break wire to electrodes of electronic components or to other wires. In contrast, a non-conducting diffusion-break line is made entirely of insulating materials. First layout 101A shows one row of CFETs, each CFET being a stack of an n-type and a p-type GAAFET. In contrast, second layout 101B, being for a one-transistor footprint GAAFET technology, has two rows for the same number of transistors, for example, one row for n-type and one row for p-type GAAFETs, marked as n-GAAFET and p-GAAFET, respectively in FIG. 1. As illustrated in FIG. 1, each row is split into segments by the diffusion breaks 105A/105B, where each segment is one diffusion area 111A/111B of the respective row. The standard cell shown in first layout 111A and second layout 101B has two diffusion areas 111A/111B in each row of diffusion areas 111A/111B. At each intersection between a gate structure 103A/103B and a diffusion area 111A/111B, a portion of the diffusion area 111A/111B common to the gate structure 103A/103B is a transistor channel area 107A/107B (indicated by a dotted X in FIG. 1). The remaining portion of the diffusion area 111A/111B comprises a S/D 109A/109B. Each diffusion area 111A/111B has at least one transistor channel 107A/107B and two S/Ds 109A/109B. However, a diffusion area 111A/111B may have multiple intersecting gate structures 103A/103B creating multiple channel areas 107A/107B with a S/D 109A/109B between adjacent channel areas 107A/107B.

Lines of diffusion breaks may be created by using a diffusion-cut etch to form diffusion-break trenches along the column direction, each trench often cutting through several rows of diffusion areas, as described in further detail below. Subsequently, some of the diffusion-break trenches are selectively filled with insulating material, forming non-conducting diffusion-break lines 105A/105B, while other diffusion-break trenches are selectively filled to form diffusion-break wires 112A/112B. A diffusion-break wire 112A/112B includes a conductive core insulated from the adjacent diffusion-areas by an insulating outer liner formed along the sidewall and bottom wall of the respective diffusion-break trench, as described in further detail below. In some embodiments, the diffusion break wire 112A/112B may include a vertical stack comprising a first conductive core, a second conductive core below the first conductive core, and an insulating layer that insulates the second conductive core from the first conductive core. Electrical connections may be made to the conductive cores of the diffusion-break wires 112A/112B using vertical and lateral connectors. Through these connectors, the conductive cores may be coupled to transistor electrodes and also to the multilevel interconnect system of the IC. Thus, the diffusion-break wire 112A/112B may be utilized as an additional routing track and provide an advantage of relieving wiring congestion in aggressively scaled standard cells designed for advanced digital CMOS ICs.

The evolution of three-dimensional (3D) transistor architecture from the single transistor footprint (e.g., FinFET and GAAFET) to the stacked transistor concept of the CFET has increased the packing density of transistors but, that aggravates the wiring congestion in standard cells. Typically, in a standard cell, the back-end-of-line (BEOL) metal interconnect lines of the lowest wiring level above the transistors run perpendicular to the gates and are used for routing signals and power supply between transistors in different columns. One measure of area efficiency and packing density of a CMOS digital logic technology is the cell height of a standard cell layout. The cell height is the cell dimension parallel to the transistor gates, for example, the cell-heights HA and HB of the first layout 111A and the second layout 101B, respectively, in FIG. 1. As mentioned above, cell height is expressed as a multiple of a minimum pitch of wiring tracks of metal interconnect available for routing signals, power supply and ground. Thus, the drive for lowering cell height to reduce the cost per function of digital ICs by increasing cell density squeezes the number of wiring tracks for routing.

Logic IC designs with FinFETs (the most widely used 3D transistor architecture) may use fewer fins per transistor to reduce the cell height, which pushes the technology to taller fins to help restore the total drive current of the transistor. A GAAFET structure uses parallel channels in a vertical stack of nanosheets; hence, the cell height in CMOS GAAFET technology may be reduced by shrinking the stack width parallel to the gates. The loss in transistor drive with a shrinking stack-width forces the GAAFET technology to increase the number of nanosheets in a stack to recover the total drive current, analogous to increasing the fin-height. However, limited scaling of cell height may be achieved using FinFETs with tall fins or GAAFETs because of processing complexity and increased parasitic S/D resistance associated with high aspect ratio fin spacing and GAAFET gate structure wrapping around a tall stack of a large number.

The CFET concept of stacking transistors provides an opportunity for reducing cell height markedly by cutting back the number of rows of diffusion areas in a cell, as seen from a comparison of first layout 101A with second layout 101B in FIG. 1. As explained above, the drastically reduced cell height of the aggressively scaled standard cell also implies a similarly large reduction in the number of wiring tracks parallel to the rows of diffusion areas available for connecting the transistors to the circuit network. While some IC technologies provide an extra interconnect level in a portion of the substrate below the transistors for buried power lines, further relief to the wiring congestion may be obtained by using the embodiments of the diffusion-break wires 112A/112B as a routing track parallel to the columns of gate structures, as described in this disclosure.

Figure 2A:
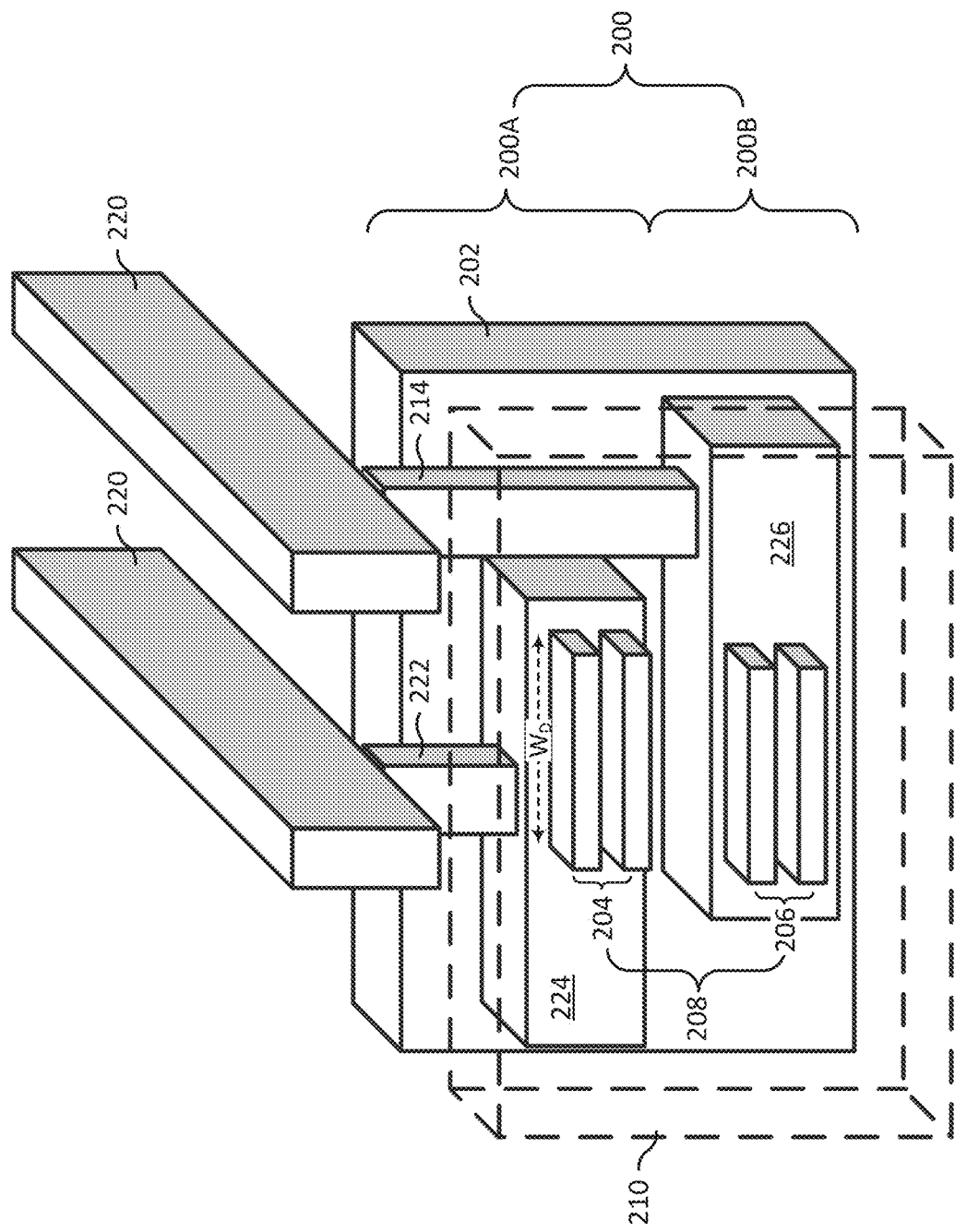
FIGS. 2A and 2B illustrate a perspective view of a CFET and a diffusion-break wire, in accordance with some embodiments.
Figure 2B:
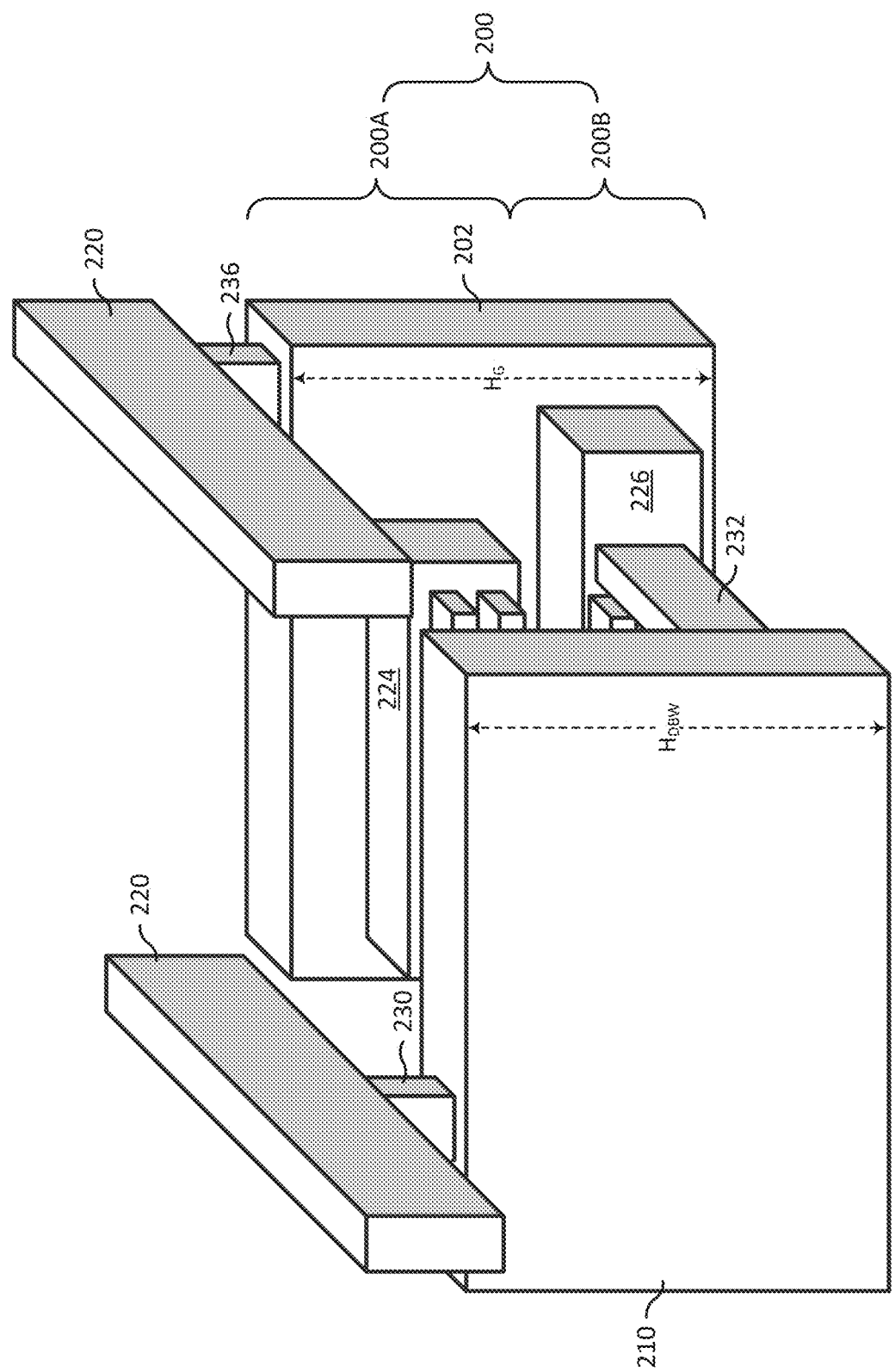

FIGS. 2A and 2B illustrate a perspective view of a CFET 200 and a diffusion-break wire 210. In FIG. 2A, the location of the diffusion-break wire is indicated by a dashed rectangular block for a clearer view of the CFET 200 and, in FIG. 2B, the diffusion-break wire 210 is shown as a solid rectangular block, along with a first conductive pillar 230 and a lateral second wire bridge 232 (first and second wire bridges are described in further detail below) as the vertical and lateral connectors making electrical connection to a conductive core of the diffusion-break wire 210.

The CFET 200, shown in FIG. 2A, is a stack of a first transistor 200A and a second transistor 200B. In this example, the first transistor 200A and the second transistor 200B are GAAFETs, each GAAFET comprising two nanosheets of a stack of four nanosheets. In general, the transistors may be of any type and but, for specificity, in this embodiment, the first transistor 200A may be a p-type GAAFET, and the second transistor 200B may be an n-type GAAFET comprising bottom two nanosheets. In some other embodiment, the number of nanosheets for each transistor may be unequal and may also be some number other than two.

A gate structure 202 wraps around the four nanosheets to form a CFET channel and extends beyond the stack. The CFET channel, being the portion of the nanosheets covered by the gate structure 202, is not visible in FIGS. 2A and 2B. A first channel of the first transistor 200A comprises the portion of the top two nanosheets embedded in the gate structure 202 and a second channel comprises a similar portion of the bottom two nanosheets. The lateral dimension of the nanosheet stack parallel to the gate structure 202 is the width of the diffusion area, WD (indicated by a double arrow in FIG. 2A). In this example, the gate structure 202 is shared between the pair of stacked transistors. However, it is understood that a split-gate CFET structure may also be used. In the split-gate CFET structure, a gate electrode of each of the stacked transistors of the split-gate CFET may be biased independently.

The portion of the nanosheets that extend from under the gate outside the CFET channel is the CFET S/D 208, illustrated in FIG. 2A. The CFET S/D 208 has one pair of S/D regions along two opposite sides of the gate structure 202 for a total of four S/D regions. In FIG. 2A, a first (upper) S/D region 204 comprising nanosheets of the first transistor 200A and a second (lower) S/D region 206 comprising nanosheets of the second transistor 200B are visible on one side of the gate structure 202.

The CFET S/D 208 may be configured to construct four S/D interconnect lines, each line connecting to a respective S/D region. In FIGS. 2A and 2B, a first (upper) S/D interconnect line 224 (connected to the first S/D region 204) and a second (lower) S/D interconnect line 226 (connected to the second (lower) S/D region 206) run parallel alongside one side of the gate structure 202. The S/D interconnect lines, such as the first (upper) S/D interconnect line 224 and the second (lower) S/D interconnect line 226, may be used as local interconnect tracks to directly couple adjacent CFET S/D regions along a column of CFETs.

The S/D interconnect lines may also be coupled to the BEOL metal interconnect system using vertically conducting connectors and, thereby, to electrodes of various other circuit components. For example, the perspective view of the CFET 200 in FIG. 2A illustrates a second conductive pillar 222 providing a connection between the first (upper) S/D interconnect line 224 and a metal interconnect line 220 of a wiring level above the first (upper) S/D interconnect line 224. A third conductive pillar 214 in FIG. 2A, taller than the second conductive pillar 222, connecting the second (lower) S/D interconnect line 226 to a metal interconnect line 220. Since the S/D interconnect lines (e.g., the first (upper) S/D interconnect line 224 and the second (lower) S/D interconnect line 226) are connected to the respective S/D regions (e.g., the first (upper) S/D region 204 and the second (lower) S/D region 206), a conductive pillar connecting a S/D interconnect line to a metal interconnect line (e.g., the metal interconnect lines 220) may be regarded as a S/D contact.

In this embodiment, the metal interconnect lines 220 are wires of the lowest interconnect level above the CFET 200. The metal interconnect lines 220 of the lowest interconnect level above the CFET 200 are typically oriented perpendicular to the transistor gates to facilitate routing signals and power supply between transistors in different columns of a standard cell. Much of the routing of signals between transistors in different rows of a standard cell may be achieved through the metal gate electrodes of the gate structures 202 and the first (upper) and the second (lower) S/D interconnect lines 224 and 226. The diffusion-break wire 210 provides yet another routing track along the same direction as the gate structures 202 and the first (upper) and the second (lower) S/D interconnect lines 224 and 226.

FIG. 2B illustrates the connectors making connections to the diffusion-break wire 210 and the gate structure 202. The diffusion-break wire 210 is disposed in a diffusion break line formed parallel to the gate structure 202 of the CFET 200. As illustrated in FIG. 2B, the first conductive pillar 230 provides an electrical connection between the conductive core of the diffusion-break wire 210 and the metal interconnect line 220 above the diffusion-break wire 210. The gate structure 202 is connected to another metal interconnect line 220 above the gate structure 202 through another vertically conducting pillar, referred to as a gate contact 236.

In addition to a vertical connector, such as the first conductive pillar 230, making an electrical connection through a top surface of the diffusion-break wire 210, a lateral electrical connection may be made to the conductive core of the diffusion-break wire 210 through a sidewall of the diffusion-break wire 210. The lateral connector may be a laterally conducting wire bridge between the conductive core of the diffusion-break wire 210 and an adjacent S/D interconnect line. Since the CFET structures such as CFET 200 provides a first (upper) S/D interconnect line 224 and a second (lower) S/D interconnect line 226 at two different vertical locations, there may be a respective first wire bridge and a second wire bridge connecting through one sidewall of the diffusion-break wire 210. A second wire bridge 232 is shown in FIG. 2B connecting the conductive core of the diffusion-break wire 210 to the second (lower) S/D interconnect line 226.

The second wire bridge, such as the second wire bridge 232 illustrated in FIG. 2B, is particularly useful in embodiments where the conductive core of a diffusion-break wire is a vertical stack comprising a second conductive core formed below the first conductive core and an insulating layer electrically isolating the two conductive cores from each other. The second conductive core of a two-tier diffusion-break wire may also be coupled to electrodes of circuit components using a conductive pillar (referred to as the fourth conductive pillar) making a connection to the lower portion of the two-tier diffusion-break wire. The fourth conductive pillar may be formed in a deep hole extending below the upper portion of the two-tier diffusion-break wire to expose a top surface of the second (lower) conductive core of the two-tier diffusion-break wire. The deep hole may be filled to form the fourth conductive pillar, where the fill comprises an inner conductor. The inner conductor may be insulated from any adjacent portion of the first (upper) conductive core of the two-tier diffusion-break wire by an outer insulating jacket.

In some embodiments, where the IC technology provides an interconnect level in a portion of the substrate below the transistors (e.g., for buried power lines), it may be possible to fabricate a conductive pillar making an electrical connection through the bottom wall of the diffusion-break wire (e.g. the diffusion-break wire 210).

A method of forming a diffusion-break wire in a standard cell for a digital CMOS technology using CFETs, for example, the diffusion-break wire 112A in the simplified standard cell layout (first layout 101A), illustrated in FIG. 1 is described with reference to FIGS. 3A-3D. FIG. 3E illustrates an alternative cross-sectional view of the simplified standard cell illustrated in FIG. 3D. The vertical cross-sections in FIG. 3A-3E are of a simplified standard cell 300 having a first layout 101A along a cut line 3A-3E, indicated by a dot-dash line in FIG. 1.

As described above with reference to FIGS. 2A and 2B, the example CFET is a vertical stack of a p-type GAAFET above an n-type GAAFET. The CFET channel comprises a nanosheet stack of four nanosheets, where the top two nanosheets are used to form the p-type GAAFET and the bottom two nanosheets are used for the for the n-type GAAFET. The CFET is fabricated using a replacement metal gate (RMG) method. In the RMG method, CFET dummy structures comprising the CFET channel, the CFET S/D, and the CFET S/D interconnect structures (described above with reference to FIGS. 2A and 2B) are first formed with a sacrificial (or dummy) CFET gate structure. The dummy CFET structure is inlaid in an insulating layer, referred to as a pre-metal dielectric (PMD) layer. The sacrificial CFET gate structure is subsequently removed and replaced with a gate stack comprising a high-k gate dielectric layer and a metal gate electrode, referred to as an HKMG gate stack, to form the CFET gate structure.

The CFET dummy structures comprising the sacrificial gate structures are formed not only to subsequently form active transistors but also to form diffusion-break trenches that may be subsequently filled to form diffusion-break wires, as described further below.

Figure 3A:
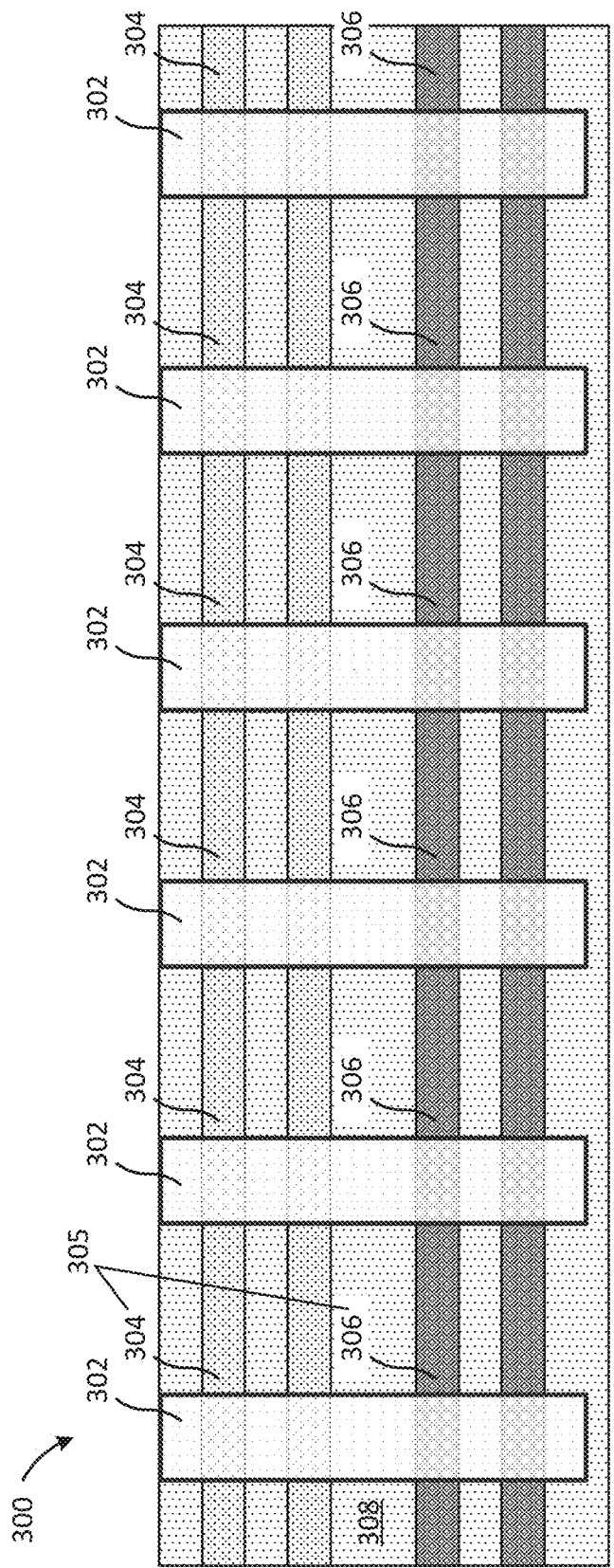

FIG. 3A illustrates a cross-sectional view of the simplified standard cell 300 shown in first layout 101A illustrated in FIG. 1. The cross-sectional view illustrated in FIG. 3A shows the vertical structure of the cell at a stage of fabrication after the CFET dummy structures have been formed and inlaid in the PMD layer 308. The CFET S/D interconnect structure (described with reference to FIGS. 2A and 2B) are not shown for the sake of clarity.

As illustrated in FIG. 3A, the CFET nanosheet stack has four nanosheets that also extend in the direction normal to the plane of the cross-section. The nanosheet stack has been patterned to form lines of nanosheet stack 305. The nanosheets 304 of a line of nanosheet stack 305 are the two top nanosheets which may be used to form the p-type GAAFETs (the first transistors of the CFETs), and the two bottom nanosheets may be used to form the n-type GAAF-ETs (the second transistors of the CFETs). Sacrificial gate structures 302 are drawn in FIG. 3A as semi-transparent shapes to illustrate that the nanosheets 304 and 305 of the nanosheet stack 305 are embedded in the sacrificial gate structures 302. The sacrificial gate structures 302 may comprise, for example, a thin silicon oxide layer and a polycrystalline or amorphous silicon layer formed over the silicon oxide layer.

Figure 3B:
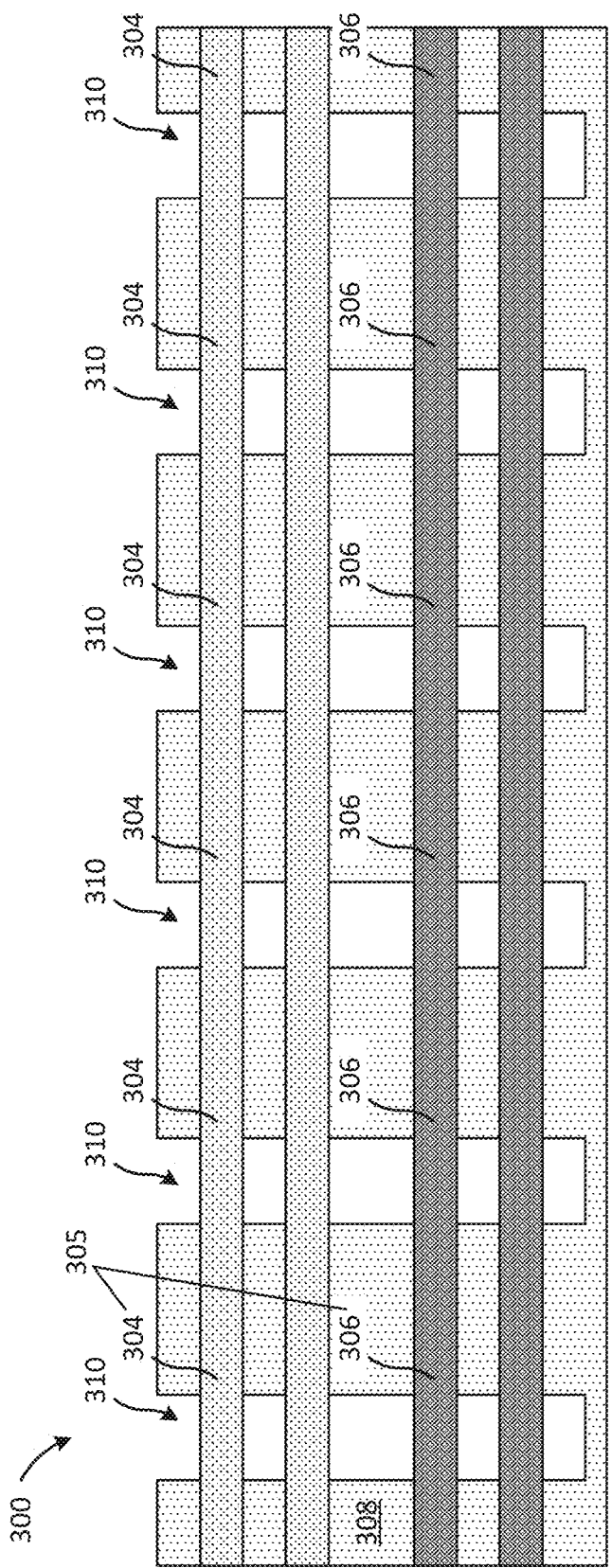

In FIG. 3B, the sacrificial gate structures 302 have been removed, forming trenches 310 in the PMD layer 308 having a depth dimension similar to a height dimension of the sacrificial gate structures 302. The sacrificial gate structures 302 have been removed using a selective etch chemistry to reveal the nanosheets 304 and 306 inside the trenches 310. After the sacrificial gate structures 302 have been removed, a patterned diffusion-cut etch may be performed on selected trenches 310.

Figure 3C:
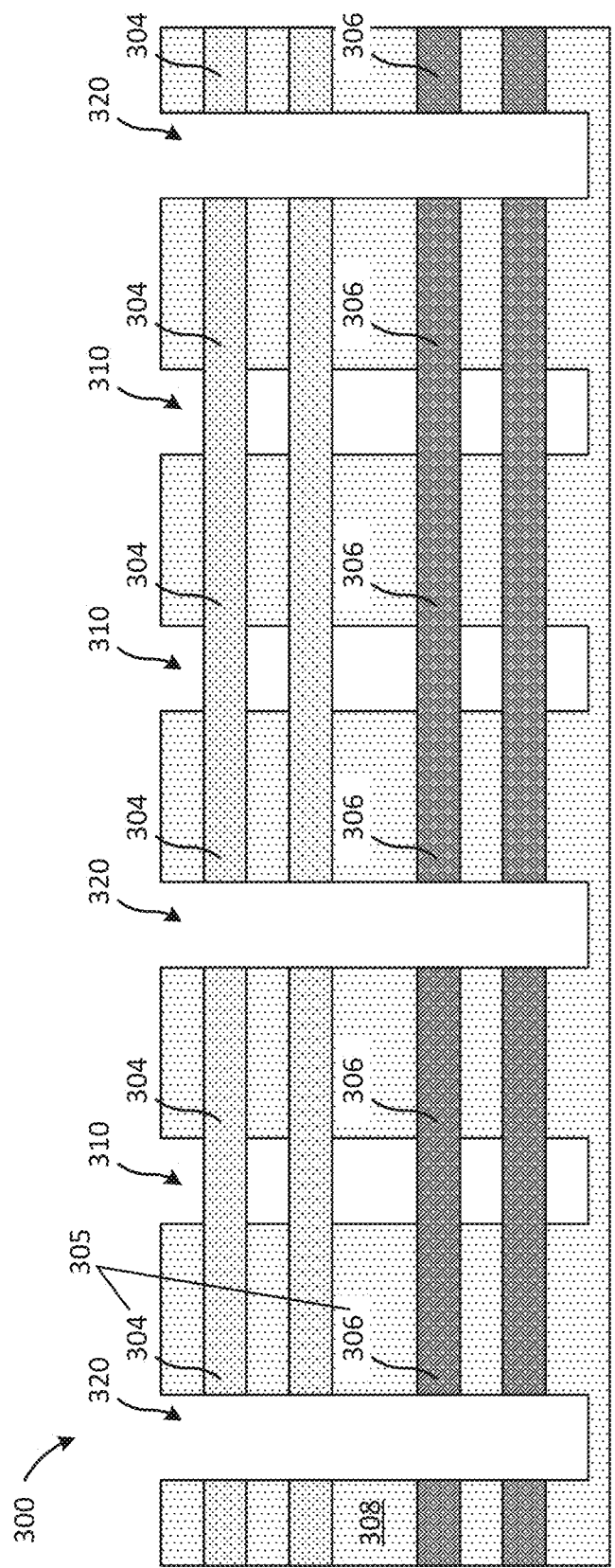

FIG. 3C illustrates the vertical structure of the simplified standard cell 300 after the diffusion-cut etch has been performed using a patterned etch mask to remove the exposed nanosheets 304 and 306 from selected trenches, forming diffusion-break trenches 320. The diffusion-break trenches 320 break the lines of nanosheet stack 305 into line segments that are the diffusion areas for CFETs, as mentioned above. As explained further below, subsequently, some of the diffusion-break trenches 320 may be filled with insulating material to form non-conducting diffusion-break lines. The remaining diffusion-break trenches 320 are used to form conductive diffusion-break wires. It is noted that, since the conductive cores of the diffusion-break wires are formed in a region vacated by removing the sacrificial gate structures 302, the geometry of the diffusion-break wires is coincident with the geometry of the respective sacrificial gate structures.

Figure 3D:
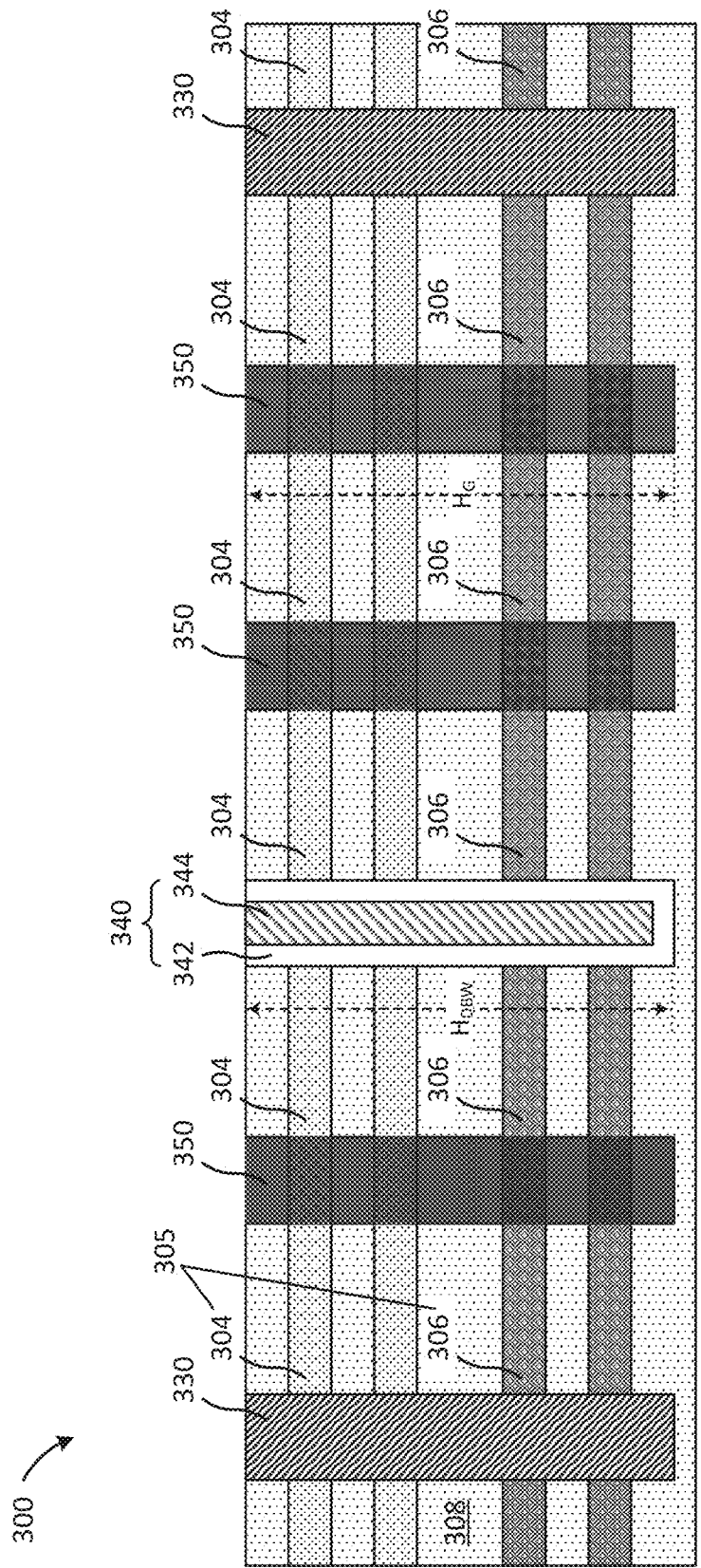
Figure 3E:
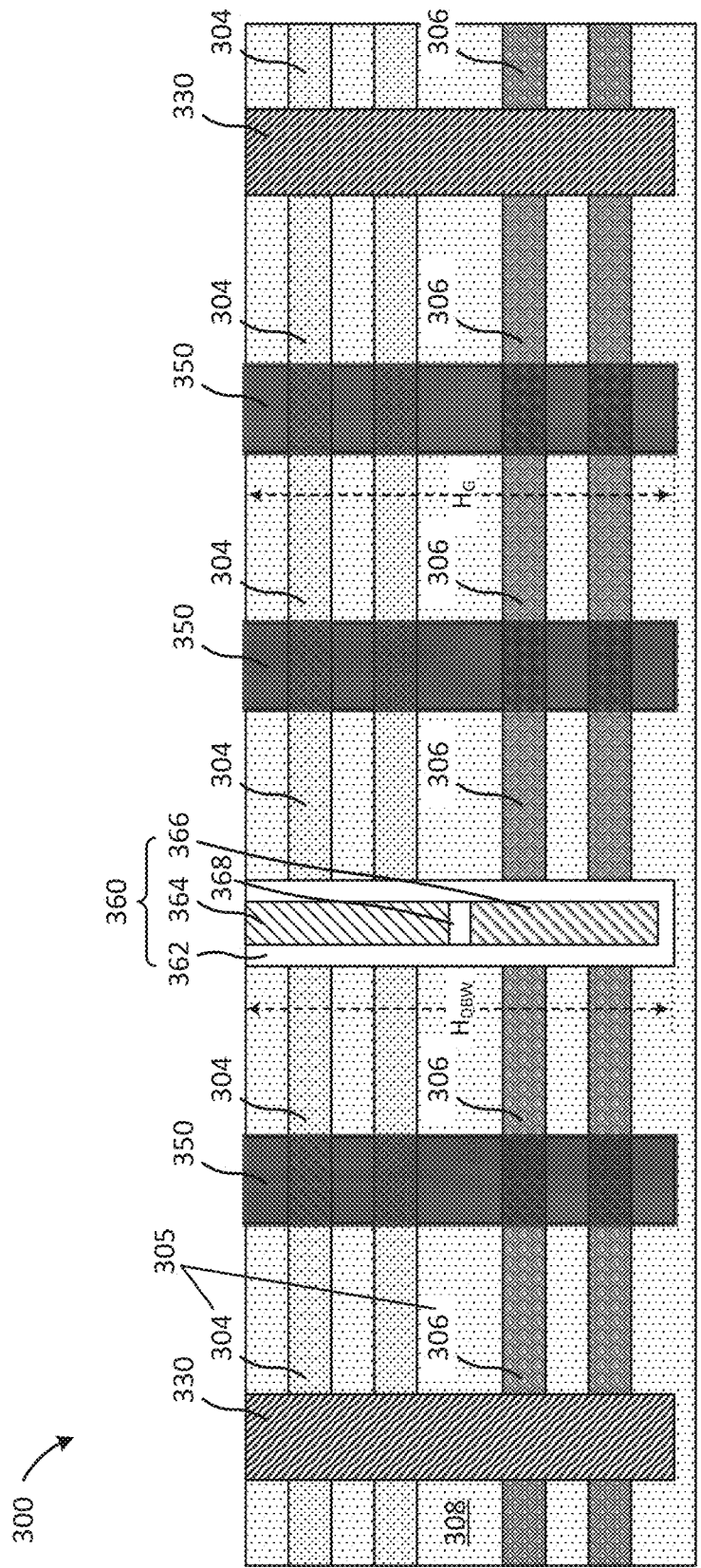
FIG. 3E illustrates a cross-sectional view of the simplified standard cell illustrated in FIG. 3D, in accordance with another embodiment.

In FIG. 3D, the trenches 310 in the diffusion areas and the diffusion-break trenches 320 between adjacent diffusion areas have been filled and etched back. The trenches 310 in the diffusion areas are selectively filled with an HKMG gate stack and etched back to form CFET gate structures 350, as illustrated in FIG. 3D. The two diffusion-break trenches 320, located at the two ends of the simplified standard cell 300 have been selectively filled with an insulating material (e.g., silicon oxide) and planarized using an etchback process to form two non-conducting diffusion-break lines 330.

The remaining diffusion-break trench 320 in the simplified standard cell 300 has been used to form a diffusion-break wire 340. As illustrated in FIG. 3D, an insulating outer liner 342 has been formed along the sidewall and bottom wall of the diffusion-break trench 320. The rest of the diffusion-break trench 320 is filled with a conductive material to form the conductive core 344. The insulating outer liner 342 may comprise a dielectric material such as silicon oxide or silicon nitride, and the conductive material of the conductive core 344 may comprise a metallic material, for example tungsten, titanium, titanium nitride, tantalum, tantalum nitride, aluminum, metal alloys, and metal silicides.

After the diffusion-break wire 340 is formed, vertical and lateral connectors may be formed to connect the diffusion-break wire to electrodes of transistors and other circuit components, as described above with reference to FIGS. 2A and 2B. The other circuit components may include active devices including diodes and transistors, and passive devices including capacitors, inductors, and resistors. It is noted that both the transistor gates and the diffusion-break wire are formed in trenches vacated by the sacrificial gate structures. Hence, the height, HDBW (indicated by a double arrow), of the diffusion-break wire 210 in FIG. 2B (also the diffusion-break wires 340 and 360 in FIGS. 3D and 3E) is roughly the same as the height, HG (indicated by another double arrow in FIG. 2B) of the gate structure 202 in FIG. 2B (also the gate structures 350 in FIGS. 3D and 3E). The similarity in height may provide an advantage of using the same processing to form the first conductive pillars 230 and the gate contacts 236.

FIG. 3E illustrates another embodiment of the diffusion-break wire 360 having a two-tier conductive structure, different from the one-tier conductive structure of the diffusion-break wire 340 in FIG. 3D. As illustrated in FIG. 3E, the insulating outer liner 362 of the diffusion-break wire 360 is similar to the insulating outer liner 342 of the diffusion-break wire 340 in FIG. 3D. However, unlike the diffusion-break wire 340 (shown in FIG. 3D), the diffusion-break wire 360 has, in addition to the insulating outer liner 362, a first conductive core 364, a second conductive core 366, and an insulating layer 368 between the first conductive core 364 and the second conductive core 366. Connecting the two-tier conductive core of the diffusion-break wire 360 using vertically conducting pillars and laterally conducting wire bridges has been described above with reference to FIG. 2B. The processing performed to form the trenches 310 and the diffusion-break trenches 320 in the PMD layer 308 for the two-tier conductive structure of diffusion-break wire 360 may be similar to that used for forming the diffusion-break wire 340, as described above with reference to FIGS. 3A-3C. As illustrated in FIG. 3E, the upper conductor of the two-tier conductive structure is the first conductive core 364 and the lower conductor is the second conductive core 366. The diffusion-break trenches 320 may be filled using a multi-step process to sequentially form the lower tier comprising the second conductive core 366 prior to forming the upper tier comprising the first conductive core 364.

Figure 4A:
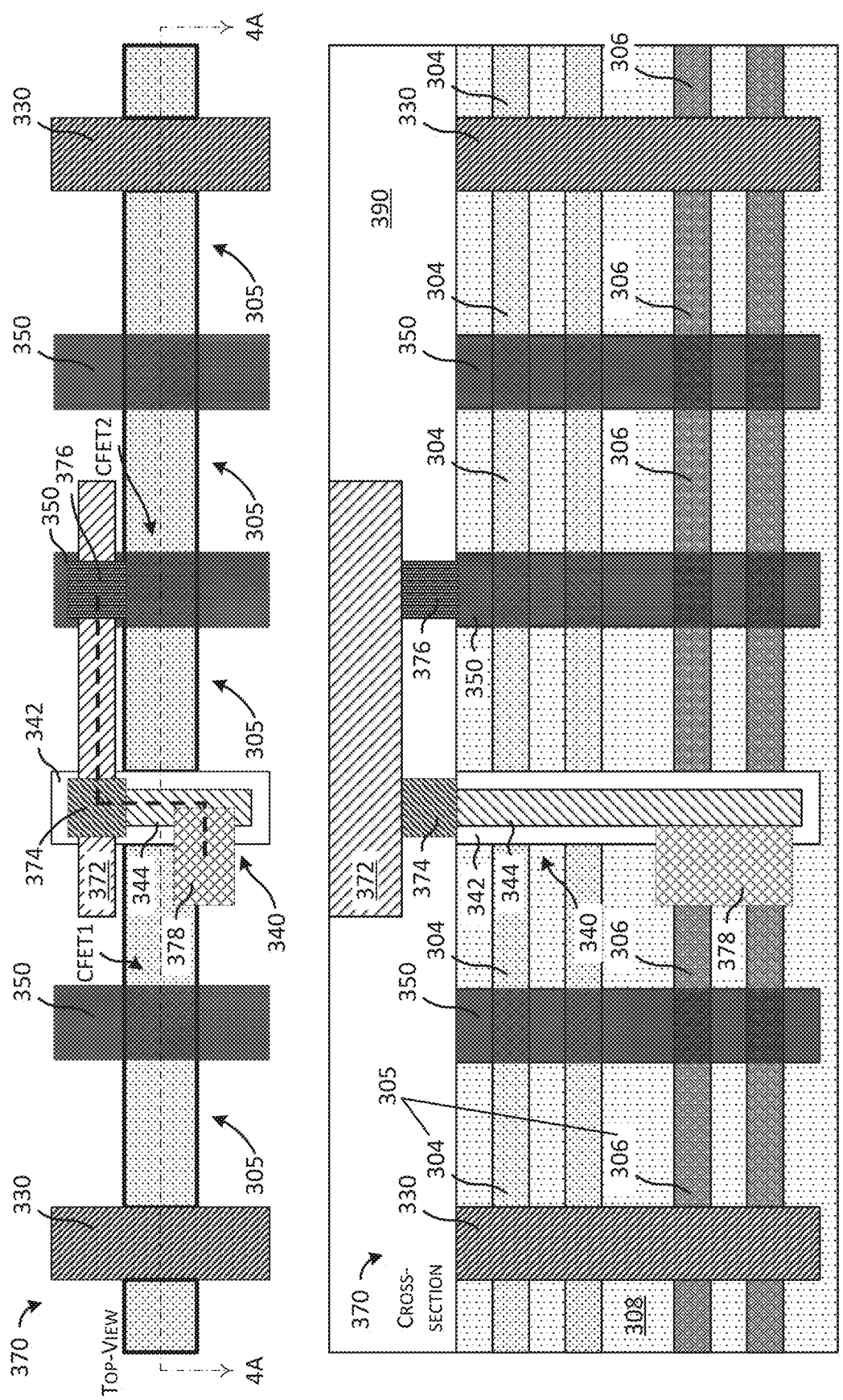
FIGS. 4A and 4B illustrate a top-view and a respective cross-sectional view of a simplified standard cell, in accordance to an embodiment.
Figure 4B:
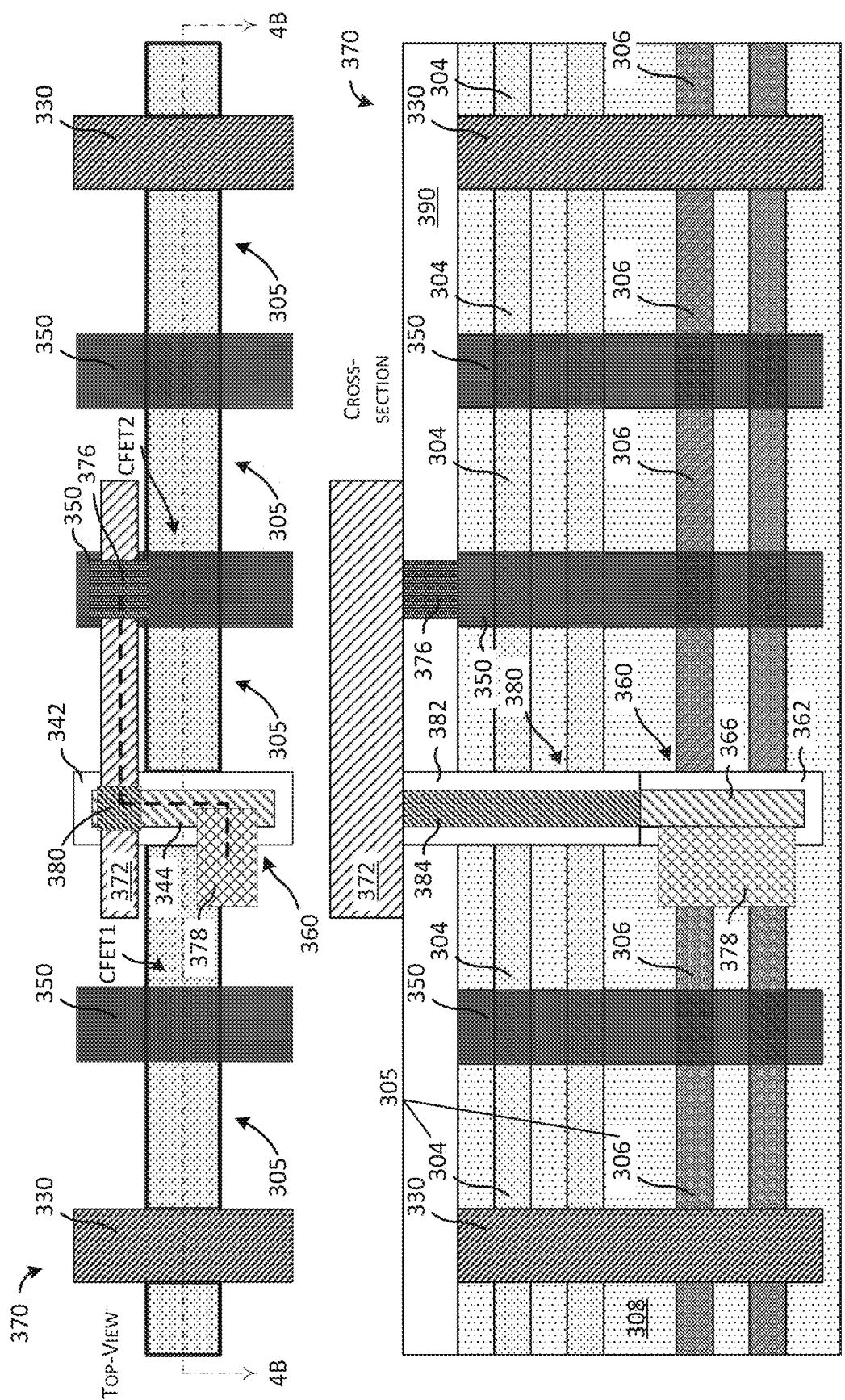

FIGS. 4A-4B illustrate vertical and lateral connections to diffusion-break wires with reference to a top-view and a respective cross-sectional view of a simplified standard cell 370. The standard cell 370 is similar to the simplified standard cell described with reference to first layout 101A in FIG. 1 and the cross-sectional views of standard cell 300 in FIGS. 3A-3E.

As mentioned above with reference to FIG. 2B, vertically conducting conductive pillars and laterally conducting wire bridges may be formed to make electrical connections to the top surface and sidewalls of conductive cores of diffusion-break wires, respectively. First wire bridges contact an upper portion of diffusion break wires and second wire bridges contact a lower portion of diffusion break wires. First conductive pillars contact a top surface of the first conductive core, which is the conductor in the one-tier diffusion-break wire or the upper conductor of the two-tier diffusion-break wire. As mentioned above, taller fourth conductive pillars contact a top surface of the second conductive core, which is the lower conductor in the two-tier diffusion-break wire.

The cross-sectional view of standard cell 370 in FIGS. 4A and 4B start with the cross-sectional view of the standard cell 300 illustrated in FIGS. 3D and 3E. Similar to FIGS. 3D and 3E, FIGS. 4A and 4B also show the simplified standard cell 370 having one row of the nanosheet stack 305 and six columns comprising two non-conducting diffusion-break lines 330, three CFET gate structures 350, and one diffusion-break wire.

FIG. 4A shows the one-tier diffusion-break wire 340 having the first conductive core 344 insulated by the insulating outer liner 342. The first conductive pillar 374 in FIG. 4A is shown making a contact to the top surface of the first conductive core 344.

FIG. 4B shows the two-tier diffusion-break wire 360 having the second conductive core 366 insulated by the insulating outer liner 362 and a fourth conductive pillar 380. The fourth conductive pillar 380 comprises an inner conductor 384 and an outer insulating jacket 382. The inner conductor 384 of the fourth conductive pillar 380 in FIG. 4B is shown making a contact to the top surface of the second conductive core 366.

Also similar to FIGS. 3D and 3E, the full CFET S/D interconnect structure (described with reference to FIGS. 2A and 2B) including the first (upper) and second (lower) S/D interconnect lines are not shown in FIGS. 4A and 4B for the sake of clarity. The S/D interconnect lines are shown further below in a more complex standard cell layout 400, illustrated in FIGS. 5A-5C.

In addition to the structure of the standard cell 300 shown in FIG. 3D, FIGS. 4A and 4B illustrate the metal interconnect line 372, the first conductive pillar 374, the fourth conductive pillar 380, the gate contact 376, embedded in an interlayer dielectric (ILD) layer 390, and the second wire bridge 378 in the standard cell 370. Similar to the second (lower) S/D interconnect line 226 and the second wire bridge 232 in FIG. 2B, the second wire bridge 378 is physically connected at one end to the lower portion of the first conductive core 344 of the one-tier diffusion-break wire 340 in FIG. 4A, and to the second (lower) conductive core of the two-tier diffusion break wire 360 in FIG. 4B. The opposite end is connected to the respective second (lower) S/D interconnect line (not shown) originating from nanosheets 306 of a first CFET (indicated as CFET1 in FIGS. 4A and 4B) drawn to the left of the diffusion-break wire 340. The bottom ends of the first conductive pillar 374 and the fourth conductive pillar 380 are physically connected to a top surface of the first conductive core 344 of the one-tier diffusion-break wire 340 and to a top surface of the second conductive core 366 of the two-tier diffusion-break wire 360, respectively. The top end of the first conductive pillar 374 and the fourth conductive pillar 380 make a physical connection with a bottom surface of the metal interconnect line 372. The fourth conductive pillar 380 may be encircled by the outer insulating jacket 382 to prevent unintentional electrical shorting between the fourth conductive pillar 380 and an adjacent first (upper) conductive core of the two-tier diffusion-break wire 360. (A first conductive core 364 is shown in FIG. 3E, but is not visible in FIG. 4B). The metal interconnect line 372 is connected to the top end of the gate contact 376. The bottom end of the gate contact 376 is physically connected to the common gate of the CFET gate structure 350 of a second CFET (indicated as CFET2 in FIGS. 4A and 4B). The conductive signal path established between the second S/D region (the lower S/D region comprising nanosheets 306) of CFET1 to the CFET gate structure 350 of CFET2 via the diffusion-break wire 340 is indicated by a dashed line in FIGS. 4A and 4B.

Figure 5A:
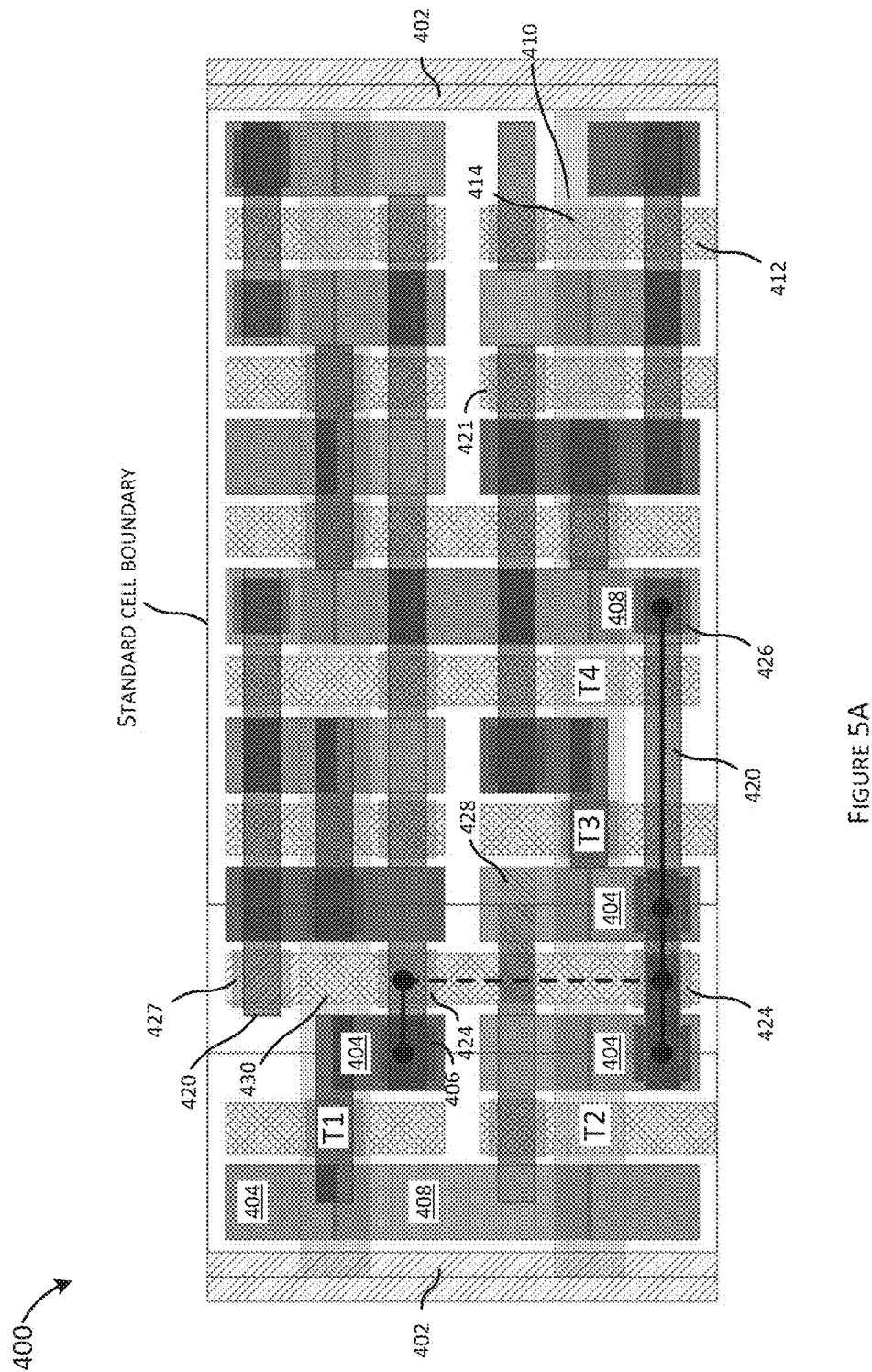
FIGS. 5A-5B illustrate a standard cell layout, in accordance with an embodiment.
Figure 5B:
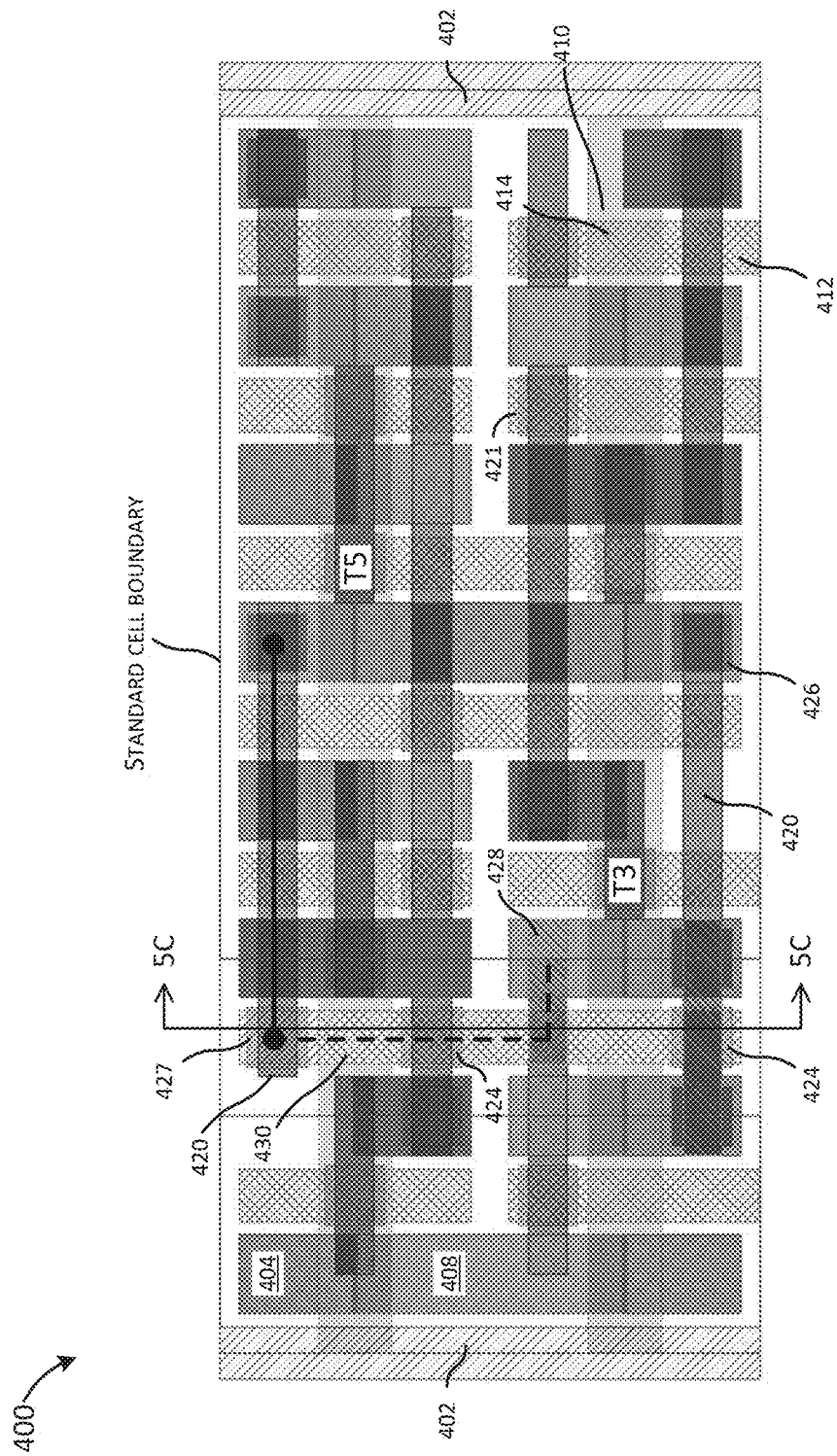
Figure 5C:
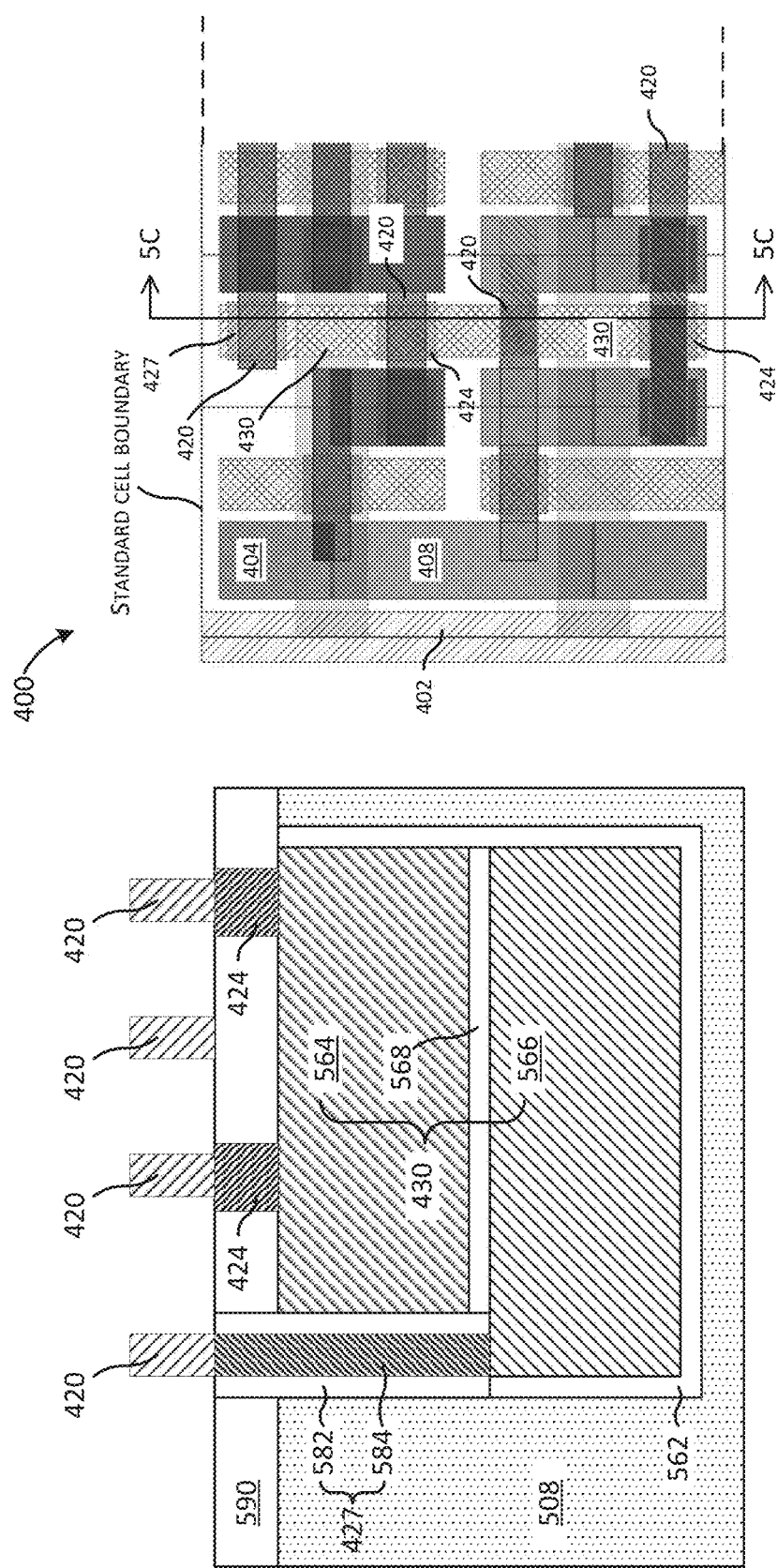
FIG. 5C illustrates a cross-sectional view of a diffusion-break wire in the standard cell layout illustrated in FIGS. 5A-5B.

FIGS. 5A-5C illustrate an example standard cell layout 400 to demonstrate enhancement in routing capability achieved by connections to an example two-tier diffusion-break wire 430. It is noted that the power supply lines have been removed from the layout diagram in FIGS. 5A and 5B for clarity. The same standard cell layout 400 is illustrated in the FIGS. 5A-5C. FIG. 5A illustrates connections that have been made with the first (upper) conductive core of a two-tier diffusion-break wire 430 and FIG. 5B illustrates connections that are made with the second (lower) conductive core of the two-tier diffusion-break wire 430. FIG. 5C illustrates a cross-sectional view of the two-tier diffusion-break wire 430 showing first conductive pillars 424 connecting the first conductive core 564 of the two-tier diffusion break wire 430 and a fourth conductive pillar 427 connecting the second conductive core 566 of the two-tier diffusion break wire 430 to metal interconnect lines 420 of the lowest interconnect level above the diffusion-break wire 430.

The various drawn layers shown in FIGS. 5A and 5B include gate structures 412 and diffusion areas 410 drawn perpendicular to each other. Transistor channels 414 are formed at the intersections of gate structures 412 with diffusion areas 410. Two non-conducting diffusion-break lines 402 are drawn at the two ends of the standard cell layout 400 to isolate the standard cell from adjacent standard cells that may be placed along the same row. First (upper) and second (lower) S/D interconnect lines 404 and 408 are drawn parallel to the gate structures 412. As explained above, the S/D interconnect lines 404 and 408 are physically connected to respective diffusion areas 410. Metal interconnect lines 420 are drawn perpendicular to the S/D interconnect lines 404 and 408. Vertical connections to the metal interconnect lines 420 are made by conductive pillars. The various conductive pillars in standard cell layout 400 include gate contacts 421 connecting to gate structures 412, first and fourth conductive pillars 424 and 427 connecting to the first (upper) conductive core and the second (lower) conductive core, respectively, of the two-tier diffusion-break wire 430. In some embodiments, gate contacts 421 and the first conductive pillars 424 may be formed simultaneously. The second and third conductive pillars 406 and 426 connect metal interconnect lines 420 to the first (upper) and second (lower) S/D interconnect lines 404 and 408, respectively. The standard cell layout 400 is not using a first lateral bridge to connect a first (upper) S/D interconnect line 404 to the first conductive core of the two-tier diffusion-break wire 430 but, a second lateral bridge 428 is drawn connecting a second (lower) S/D interconnect line 408 to the second (lower) conductive core of the two-tier diffusion-break wire 430.

A connection route is indicated by solid lines for lateral segments parallel to rows comprising metal interconnect lines 420 and lateral segments parallel to columns comprising first (upper) and second (lower) S/D interconnect lines 404 and 408. Dotted lines are used to indicate lateral segments parallel to columns comprising diffusion-break wires 430 or lateral segments parallel to rows comprising second (lower) lateral bridges 428. Solid circles indicate vertical segments comprising first 424, second 406, third 426, or fourth 427 conductive pillars, or gate contacts 421.

FIG. 5A shows a first (upper) S/D interconnect line 404 (connected to a respective S/D region of a first CFET T1) being routed to couple to the first (upper) S/D interconnect lines 404 of second and third CFETs T2 and T3 and the lower S/D interconnect line 408 of fourth CFET T4. Starting from the first (upper) S/D interconnect line 404 of CFET T1, a signal may connect to a metal interconnect line 420 using a second conductive pillar 406. A first conductive pillar 424 connects the signal from the metal interconnect line 420 to the first (upper) conductive core of the two-tier diffusion-break wire 430. Another first conductive pillar 424 connects the signal from the first conductive core of the diffusion-break wire 430 to another metal interconnect line 420. This metal interconnect line 420 distributes the signal to the first (upper) S/D interconnect lines 404 of second and third CFETs T2 and T3 using second conductive pillars 406, and to the second (lower) S/D interconnect line 408 of fourth CFET T4 using a third conductive pillar 426.

FIG. 5B shows the lower S/D interconnect line of third CFET T3 connected to the second conductive core of the diffusion-break wire 430. The signal may connect from the second conductive core of the diffusion-break wire 430 to a metal interconnect line 420 using a fourth conductive pillar 427. The signal may couple from the metal interconnect line 420 to the second (lower) S/D interconnect line 408 of fifth CFET T5.

A cross-sectional view of the two-tier diffusion-break wire 430 in the standard cell layout 400 is illustrated in FIG. 5C. A portion of the respective layout 400 is copied over from FIG. 5B and displayed on the right side in FIG. 5C as a reference. The cross-sectional view on the left side shows the two-tier diffusion-break wire 430 comprising the first (upper) and second (lower) conductive cores 564 and 568 insulated from each other by the insulating layer 568. The diffusion-break wire 430 is seen inlaid in the PMD layer 508.

As illustrated in FIG. 5C, the two first conductive pillars 424 are connecting the first conductive core 564 of the two-tier diffusion break wire 430 to metal interconnect lines 420 of the lowest interconnect level above the diffusion-break wire 430. The conductive pillars are embedded in an ILD layer 590. The cross-sectional view in FIG. 5C further includes one fourth conductive pillar 427 connecting the second conductive core 566 of the two-tier diffusion break wire 430 to the metal interconnect line 420 near the edge of the standard cell boundary (as seen from the layout 400). As mentioned above, the fourth conductive pillar 427 comprises an inner conductor 584 and an outer insulating jacket 584. The inner conductor 584 forms a vertical connection between the interconnect line 420 directly above and the second conductive core 566. The outer insulating jacket 584 insulates the inner conductor 584 from the adjacent first conductive core 564.

The example illustrated by FIGS. 5A-5C shows how the embodiments described in this disclosure may be applied to relieve some of the wiring congestion in aggressively scaled standard logic cells.

Example embodiments of the invention are summarized here. Other embodiments can also be understood from the entirety of the specification as well as the claims filed herein.

EXAMPLE 1

A semiconductor device including: a first three dimensional (3D) transistor and a second 3D transistor oriented parallel to the first 3D transistor disposed in a substrate, the first 3D transistor and the second 3D transistor being a subset of a plurality of transistors; a diffusion-break trench disposed in a region laterally separating the second 3D transistor from the first 3D transistor, the diffusion-break trench having a length extending along a lateral direction; and a diffusion-break wire filling the diffusion-break trench, the diffusion-break wire having a height along a vertical direction, gates of the plurality of transistors being made of a different conductive material than the diffusion-break wire.

EXAMPLE 2

The device of example 1, where the first 3D transistor includes a first nanowire transistor (NWT) and the second 3D transistor includes a second NWT oriented parallel to the first NWT disposed in a substrate, the first NWT and the second NWT including a plurality of nanowires stacked along a vertical direction.

EXAMPLE 3

The device of one of examples 1 or 2, where the first 3D transistor includes a first nanosheet transistor (NT) and the second 3D transistor includes a second NT oriented parallel to the first NT disposed in a substrate, the first NT and the second NT including a plurality of nanosheets stacked along a vertical direction.

EXAMPLE 4

The device of one of examples 1 to 3, where the first 3D transistor includes a first complementary field-effect transistor (CFET) and the second 3D transistor includes a second CFET oriented parallel to the first CFET disposed in a substrate, the first CFET including the first NT and the second CFET including the second NT.

EXAMPLE 5

The semiconductor device of one of examples 1 to 4, where the diffusion-break wire includes: an insulating outer liner; and a conductive core electrically insulated from the first 3D transistor and the second 3D transistor by the outer liner.

EXAMPLE 6

The semiconductor device of one of examples 1 to 5, where the diffusion-break wire includes: an insulating outer liner; a first conductive core electrically insulated from the first 3D transistor and the second 3D transistor by the outer liner; a second conductive core electrically insulated from the first 3D transistor by the outer liner; and an insulating layer between the first conductive core and the second conductive core, the insulating layer electrically insulating the first conductive core from the second conductive core.

EXAMPLE 7

A method of forming a semiconductor device including: forming a first three dimensional (3D) transistor in a first region and a second 3D transistor oriented parallel to the first 3D transistor in a second region; forming a diffusion-break trench between the second 3D transistor and the first 3D transistor, the diffusion-break trench extending along a first lateral direction; and forming a diffusion-break wire by filling the diffusion-break trench, the diffusion-break wire having a height along a vertical direction, where filling the diffusion-break trench includes forming a conductive core, gates of the first and the second transistors being made of a different conductive material than the diffusion-break wire.

EXAMPLE 8

The method of example 7, where the first 3D transistor includes a first nanowire transistor (NWT) and the second 3D transistor includes a second NWT oriented parallel to the first NWT disposed in a substrate, the first NWT and the second NWT including a plurality of nanowires stacked along a vertical direction.

EXAMPLE 9

The method of one of examples 7 or 8, where filling the diffusion-break trench further includes forming a further conductive core separated from the conductive core by an insulating layer.

EXAMPLE 10

The method of one of examples 7 to 9, where the first 3D transistor includes a first nanosheet transistor (NT) and the second 3D transistor includes a second NT oriented parallel to the first NT disposed in a substrate, the first NT and the second NT including a stack of nanosheets stacked along a vertical direction.

EXAMPLE 11

The method of one of examples 7 to 10, where the first 3D transistor includes a first complementary field-effect transistors (CFET) and the second 3D transistor includes a second CFET oriented parallel to the first CFET disposed in a substrate, the first CFET including the first NT and the second CFET including the second NT.

EXAMPLE 12

The method of one of examples 7 to 11, where forming the diffusion-break trench includes: forming an NT dummy structure over the substrate, the NT dummy structure including a sacrificial NT gate structure wrapping around portions of the stack of nanosheets; etching the sacrificial NT gate structure to expose the portions of the stack of nanosheets; and etching the exposed portions of the stack of nanosheets.

EXAMPLE 13

The method of one of examples 7 to 12, further including: forming a vertical pillar physically connected to the conductive core and coupling the pillar to a wiring level above the diffusion-break wire.

EXAMPLE 14

The method of one of examples 7 to 13, further including forming a wire bridge physically connecting the conductive core to a S/D interconnect line connected to a S/D region of the first NT.

EXAMPLE 15

The method of one of examples 7 to 14, where forming the diffusion-break trench includes performing a sequential process flow including: forming a plurality of NT dummy structures oriented parallel to each other, each of the plurality of NT dummy structures including a sacrificial NT gate structure, an NT channel including the stack of nanosheets, an NT source/drain (S/D), and an NT S/D interconnect structure, where the sacrificial NT gate structure wraps around each nanosheet of the NT channel; inlaying the plurality of NT dummy structures in a pre-metal dielectric (PMD) layer, the inlay including an exposed surface of the sacrificial NT gate structures; selectively removing the sacrificial NT gate structures, the selective removal forming a plurality of trenches and exposing a plurality of NT channels inside the trenches; and removing the exposed NT channels from a subset of the plurality of trenches selected using a patterned etch mask, where removing the exposed NT channels from each selected trench forms a respective diffusion-break trench along the first lateral direction.

EXAMPLE 16

The method of one of examples 7 to 15, where forming a plurality of NT dummy structures includes: patterning the stack of nanosheets to form a plurality of parallel lines of nanosheet stacks extending along a second lateral direction normal to the first lateral direction; forming a plurality of parallel sacrificial gate structures embedding a portion of the lines of nanosheet stacks, each sacrificial gate structure of the plurality of sacrificial gate structures having a length extending along the first lateral direction; forming a plurality of NT S/D's including a portion of the lines of nanosheet stacks extending outside the sacrificial gate structures; and forming a plurality of NT S/D interconnect structures by configuring regions of S/D to form respective S/D interconnect lines.

EXAMPLE 17

A semiconductor device including: a first three dimensional (3D) disposed in a substrate; a first circuit component disposed in the substrate; a diffusion-break trench having a length extending along a first lateral direction; and a diffusion-break wire disposed in the diffusion-break trench, the diffusion-break wire including: an insulating outer liner; and a first conductive core, the first conductive core electrically coupled to an electrode of the first 3D transistor and an electrode of the first circuit component.

EXAMPLE 18

The device of example 17, where the first 3D transistor includes a first nanowire transistor (NWT) and the second 3D transistor includes a second NWT oriented parallel to the first NWT disposed in a substrate, the first NWT and the second NWT including a plurality of nanowires stacked along a vertical direction.

EXAMPLE 19

The semiconductor device of one of examples 17 or 18, where the first circuit component is a second 3D transistor.

EXAMPLE 20

The semiconductor device of one of examples 17 to 19, where the first conductive core is physically connected to a vertically conducting first pillar, where the first pillar is connected to a wiring level above the diffusion-break wire.

EXAMPLE 21

The device of one of examples 17 to 20, where the first 3D transistor includes a first nanosheet transistor (NT) and the second 3D transistor includes a second NT oriented parallel to the first NT disposed in a substrate, the first NT and the second NT including a plurality of nanosheets stacked along a vertical direction.

EXAMPLE 22

The device of one of examples 17 to 21, where the first 3D transistor includes a first complementary field-effect transistor (CFET) and the second 3D transistor includes a second CFET oriented parallel to the first CFET disposed in a substrate, the first CFET including the first NT and the second CFET including the second NT.

EXAMPLE 23

The semiconductor device of one of examples 17 to 22, where the first CFET includes a vertical stack of a first gate-all-around field-effect transistor (GAAFET) including a first S/D region connected to a first S/D interconnect line, and a second GAAFET including a second S/D region connected to a second S/D interconnect line.

EXAMPLE 24

The semiconductor device of one of examples 17 to 23, further including a first wire bridge, the first wire bridge physically connecting the first conductive core to the first S/D interconnect line, the first CFET being laterally adjacent to the diffusion-break wire.

EXAMPLE 25

The semiconductor device of one of examples 17 to 24, where the first S/D interconnect line is physically connected to a S/D region of a third CFET.

EXAMPLE 26

The semiconductor device of one of examples 17 to 25, where the first S/D interconnect line is physically connected to a vertically conducting second pillar, where the second pillar is connected to a wiring level above the first S/D interconnect line.

EXAMPLE 27

The semiconductor device of one of examples 17 to 26, where the diffusion-break wire further includes a second conductive core disposed in the diffusion-break trench below the first conductive core, the second conductive core being electrically insulated from the first conductive core by an insulating layer, where the second conductive core is electrically coupled to an electrode of a second CFET and an electrode of a second circuit component.

EXAMPLE 28

The semiconductor device of one of examples 17 to 27, further including a second wire bridge, the second wire bridge physically connecting the second conductive core to the second S/D interconnect line connected to a second S/D region of the second CFET, the second CFET being laterally adjacent to the diffusion-break wire.

EXAMPLE 29

The semiconductor device of one of examples 17 to 28, where the second S/D interconnect line connected to the second S/D region of the second CFET is physically connected to a S/D region of a third CFET.

EXAMPLE 30

The semiconductor device of one of examples 17 to 29, where the second S/D interconnect line connected to the second S/D region of the second CFET is physically connected to a vertically conducting third pillar, where the third pillar is connected to a wiring level above the second S/D interconnect line.

EXAMPLE 31

The semiconductor device of one of examples 17 to 30, where the second conductive core is physically connected to a vertically conducting fourth pillar, where the fourth pillar is insulated from the first conductive core and, where the fourth pillar is connected to a wiring level above the diffusion-break wire.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
a first three dimensional (3D) transistor and a second 3D transistor disposed in a substrate, the second 3D transistor oriented parallel to the first 3D transistor, the first 3D transistor and the second 3D transistor being a subset of a plurality of transistors;
a diffusion-break trench disposed in a region laterally separating the second 3D transistor from the first 3D transistor, the diffusion-break trench having a length extending along a lateral direction; and
a diffusion-break wire filling the diffusion-break trench, the diffusion-break wire having a height along a vertical direction, gates of the plurality of transistors being made of a different conductive material than the diffusion-break wire, wherein the diffusion-break wire comprises an insulating outer liner and a first conductive core electrically insulated from the first 3D transistor and the second 3D transistor by the outer liner.

2. The device of claim 1, wherein the first 3D transistor comprises a first nanowire transistor (NWT) and the second 3D transistor comprises a second NWT oriented parallel to the first NWT, the first NWT and the second NWT comprising a plurality of nanowires stacked along a vertical direction.

3. The device of claim 1, wherein the first 3D transistor comprises a first nanosheet transistor (NT) and the second 3D transistor comprises a second NT oriented parallel to the first NT, the first NT and the second NT comprising a plurality of nanosheets stacked along a vertical direction.

4. The device of claim 3, wherein the first 3D transistor comprises a first complementary field-effect transistor (CFET) and the second 3D transistor comprises a second CFET oriented parallel to the first CFET, the first CFET comprising the first NT and the second CFET comprising the second NT.

5. The semiconductor device of claim 1, wherein the diffusion-break wire comprises:
a second conductive core electrically insulated from the first 3D transistor by the outer liner; and
an insulating layer between the first conductive core and the second conductive core, the insulating layer electrically insulating the first conductive core from the second conductive core.

6. A method of forming a semiconductor device comprising:
forming a first three dimensional (3D) transistor in a first region and a second 3D transistor oriented parallel to the first 3D transistor in a second region;
forming a diffusion-break trench between the second 3D transistor and the first 3D transistor, the diffusion-break trench extending along a first lateral direction; and
forming a diffusion-break wire by filling the diffusion-break trench, the diffusion-break wire having a height along a vertical direction, wherein filling the diffusion-break trench comprises forming a conductive core, gates of the first and the second 3D transistors being made of a different conductive material than the diffusion-break wire.

7. The method of claim 6, wherein the first 3D transistor comprises a first nanowire transistor (NWT) and the second 3D transistor comprises a second NWT oriented parallel to the first NWT disposed in a substrate, the first NWT and the second NWT comprising a plurality of nanowires stacked along a vertical direction.

8. The method of claim 6, wherein filling the diffusion-break trench further comprises forming a further conductive core separated from the conductive core by an insulating layer.

9. The method of claim 6, wherein the first 3D transistor comprises a first nanosheet transistor (NT) and the second 3D transistor comprises a second NT oriented parallel to the first NT disposed in a substrate, the first NT and the second NT comprising a stack of nanosheets stacked along a vertical direction.

10. The method of claim 9, wherein the first 3D transistor comprises a first complementary field-effect transistors (CFET) and the second 3D transistor comprises a second CFET oriented parallel to the first CFET, the first CFET comprising the first NT and the second CFET comprising the second NT.

11. The method of claim 9, wherein forming the diffusion-break trench comprises:
   forming an NT dummy structure over the substrate, the NT dummy structure comprising a sacrificial NT gate structure wrapping around portions of the stack of nanosheets;
   etching the sacrificial NT gate structure to expose the portions of the stack of nanosheets; and
   etching the exposed portions of the stack of nanosheets.

12. The method of claim 9, further comprising:
   forming a vertical pillar physically connected to the conductive core and coupling the vertical pillar to a wiring level above the diffusion-break wire.

13. The method of claim 9, further comprising forming a wire bridge physically connecting the conductive core to a S/D interconnect line connected to a S/D region of the first NT.

14. A semiconductor device comprising:
   a first three dimensional (3D) transistor disposed in a substrate;
   a first circuit component disposed in the substrate;
   a diffusion-break trench having a length extending along a first lateral direction; and
   a diffusion-break wire disposed in the diffusion-break trench, the diffusion-break wire comprising:
      an insulating outer liner, and
      a first conductive core, the first conductive core electrically coupled to an electrode of the first 3D transistor and an electrode of the first circuit component.

15. The device of claim 14, further comprising a second 3D transistor disposed in the substrate, wherein the first 3D transistor comprises a first nanowire transistor (NWT) and the second 3D transistor comprises a second NWT oriented parallel to the first NWT, the first NWT and the second NWT comprising a plurality of nanowires stacked along a vertical direction.

16. The semiconductor device of claim 14, wherein the first conductive core is physically connected to a vertically conducting first pillar, wherein the first pillar is connected to a wiring level above the diffusion-break wire.

17. The device of claim 14, further comprising a second 3D transistor disposed in the substrate, wherein the first 3D transistor comprises a first nanosheet transistor (NT) and the second 3D transistor comprises a second NT oriented parallel to the first NT, the first NT and the second NT comprising a plurality of nanosheets stacked along a vertical direction.

18. The device of claim 17, further comprising a second 3D transistor disposed in the substrate, wherein the first 3D transistor comprises a first complementary field-effect transistor (CFET) and the second 3D transistor comprises a second CFET oriented parallel to the first CFET, the first CFET comprising the first NT and the second CFET comprising the second NT.

19. The semiconductor device of claim 18, wherein the first CFET comprises a vertical stack of a first gate-all-around field-effect transistor (GAAFET) comprising a first S/D region connected to a first S/D interconnect line, and a second GAAFET comprising a second S/D region connected to a second S/D interconnect line.

20. A semiconductor device comprising:
   a first three dimensional (3D) transistor and a second 3D transistor disposed in a substrate, the second 3D transistor oriented parallel to the first 3D transistor, the first 3D transistor and the second 3D transistor being a subset of a plurality of transistors;
   a diffusion-break trench disposed in a region laterally separating the second 3D transistor from the first 3D transistor, the diffusion-break trench having a length extending along a lateral direction; and
   a diffusion-break wire filling the diffusion-break trench, the diffusion-break wire having a height along a vertical direction, gates of the plurality of transistors being made of a different conductive material than the diffusion-break wire, wherein the first 3D transistor comprises a first nanowire transistor (NWT) and the second 3D transistor comprises a second NWT oriented parallel to the first NWT, the first NWT and the second NWT comprising a plurality of nanowires stacked along a vertical direction.

* * * * *